(12) United States Patent
Hou et al.

(10) Patent No.: US 9,018,938 B2
(45) Date of Patent: Apr. 28, 2015

(54) INTEGRATED DEVICE SUSPENDED AT HIGH VOLTAGE POTENTIAL FOR POWER ENERGY METERING AND PROTECTION OF DISTRIBUTION NETWORK

(75) Inventors: Tiexin Hou, Wuhan (CN); Zhengliang Bu, Wuhan (CN); Shun Hu, Wuhan (CN); Zhigui Xu, Wuhan (CN); Youyi Li, Wuhan (CN); Zhengtao Zhao, Wuhan (CN); Leping Zhang, Wuhan (CN)

(73) Assignee: Wuhan Guoce Science & Technology Co., Ltd., Wuhan (CN)

( * ) Notice: Subject to any disclaimer, the term of this patent is extended or adjusted under 35 U.S.C. 154(b) by 212 days.

(21) Appl. No.: 13/578,282

(22) PCT Filed: Apr. 25, 2011

(86) PCT No.: PCT/CN2011/073271
§ 371 (c)(1),
(2), (4) Date: Aug. 10, 2012

(87) PCT Pub. No.: WO2011/143994
PCT Pub. Date: Nov. 24, 2011

(65) Prior Publication Data
US 2013/0057255 A1 Mar. 7, 2013

(30) Foreign Application Priority Data
May 18, 2010 (CN) .......................... 2010 1 0175430

(51) Int. Cl.
*G01R 1/00* (2006.01)
*G01D 4/00* (2006.01)
(Continued)

(52) U.S. Cl.
CPC .............. *G01D 4/002* (2013.01); *G01R 21/006* (2013.01); *G01R 21/06* (2013.01); *Y02B 90/241* (2013.01); *Y02B 90/246* (2013.01); *Y04S 20/32* (2013.01); *Y04S 20/42* (2013.01)

(58) Field of Classification Search
USPC .......... 324/142, 103 R, 110, 126, 116, 117 R, 324/764.01, 114; 361/42, 49, 50, 63, 72, 361/73; 702/57, 61, 60, 64
See application file for complete search history.

(56) References Cited

U.S. PATENT DOCUMENTS 4,902,965 A * 2/1990 Bodrug et al. ................ 324/116
5,574,362 A 11/1996 Fiorina et al.
(Continued)

FOREIGN PATENT DOCUMENTS

CN 101086512 A 12/2007
CN 101216510 A 7/2008
(Continued)

*Primary Examiner* — Huy Q Phan
*Assistant Examiner* — Thang Le
(74) *Attorney, Agent, or Firm* — Maschoff Brennan

(57) ABSTRACT

An integrated device suspended at a high voltage potential for the metering and protection of a distribution network comprises a measurement current transformer (CT), a protective CT and a voltage sensor. The voltage signal is output from the voltage sensor to an electric energy metering module and first and second electric signal acquiring modules. The current signal acquired by the measurement CT is output to the electric energy metering module. The current signal acquired by the protective CT is output to the first and second electric signal acquiring modules. The electric energy metering module processes the current and voltage signals and sends the processed data to a comprehensive control module. The first and second electric signal acquiring modules send the voltage and current data to the comprehensive control module. The comprehensive control module comprehensively calculates the received data and sends the result to a low voltage terminal.

10 Claims, 5 Drawing Sheets

(51) Int. Cl.
*G01R 21/00* (2006.01)
*G01R 21/06* (2006.01)

(56) References Cited

U.S. PATENT DOCUMENTS

| | | | |
|---|---|---|---|
| 5,760,492 A * | 6/1998 | Kanoi et al. | 307/18 |
| 6,957,158 B1 * | 10/2005 | Hancock et al. | 702/61 |
| 7,660,682 B2 * | 2/2010 | Slota et al. | 702/57 |
| 7,683,605 B2 * | 3/2010 | Kagan et al. | 324/142 |
| 8,493,231 B2 * | 7/2013 | Teachman | 340/870.01 |
| 8,694,272 B2 * | 4/2014 | Ewing et al. | 702/60 |
| 8,700,347 B2 * | 4/2014 | Spanier et al. | 702/60 |
| 2003/0101008 A1 * | 5/2003 | Hart | 702/57 |
| 2008/0172192 A1 * | 7/2008 | Banhegyesi | 702/61 |
| 2010/0324844 A1 * | 12/2010 | Marti | 702/61 |
| 2013/0043725 A1 * | 2/2013 | Birkelund | 307/24 |

FOREIGN PATENT DOCUMENTS

| | | |
|---|---|---|
| CN | 101860080 A | 10/2010 |
| WO | 2008/055507 A1 | 5/2008 |

* cited by examiner

INTEGRATED DEVICE SUSPENDED AT HIGH VOLTAGE POTENTIAL FOR POWER ENERGY METERING AND PROTECTION OF DISTRIBUTION NETWORK

TECHNICAL FIELD OF THE INVENTION

The present invention relates to the high voltage power energy metering (HVEM) and protection field and in particular to an integrated device suspended at high voltage side for the HVEM and protection of a distribution network.

BACKGROUND OF THE INVENTION

Due to security demands and technical limitations, electric values of high voltage cannot be directly measured in a power system. Both protection and measurement are carried out at low voltage side, that is, both protection and measurement are carried out after potential transformers (PTs) and current transformers (CTs), which are used to convert the high-voltage and large-current signals to and low-current signals in proportionally. As shown in FIG. 1, PT 1 is a voltage converter manufactured in accordance with a proportion Ku based on the principle of electromagnetic induction. The low voltage signal, which is reduced K times via PT1, can be sampled and thus the high voltage value can be measured indirectly.

Similarly, the large current of high voltage can be reduced Ki times to a low current signal in low voltage side via CT 2 and the large current of high voltage can be measured indirectly.

A meter or protector 3 is a low-voltage energy meter or protector unit, which samples the secondary signals of a PT and a CT and measures the electric energy within a certain time, or analyses the data of voltage and current, and then determines whether to give a protection signal or not.

The traditional high voltage power energy metering (HVEM) system and distribution network protector mainly have the following problems:

1) the insulation between high voltage side and low voltage side leads to the large size of a PT or a CT and a high consumption on copper, iron and insulating materials;

2) traditional high voltage PT and high-voltage CT adopted the electromagnetic measurement technology have hidden ferromagnetic resonance problem and therefore undermines the safety of power system;

3) as it is expensive to test CT at a high voltage situation, CT are generally tested at a low voltage situation, therefore, the CT's accuracy cannot be effectively controlled under high voltage situation;

4) The accuracy grade of traditional HVEM system cannot be determined clearly under existing error control methods, therefore, the power loss caused by measure errors cannot be effectively controlled, which will lead to a severe economic loss to the power generation and supply department as well as the user.

Although the novel electronic transformers have been widely applied in digital substations, which are mainly applied at a voltage level of 110 kV and above, due to the cost factor, now a large number of traditional transformers are used for measurement and protecting units in distribution network systems, and digital substations cannot be realized truly.

The measure and protection for existing distribution network are integrated in a complete switch cabinet and both need a separate metering cabinet, which leads to a great number of devices existing in the substation of a distribution network, a large energy consumption of devices and a large area occupied.

CONTENT OF THE INVENTION

In view of the problems above, it is the object of the present invention to provide a device for realizing the metering and protection of high-voltage equipotential, which avoids the traditional complicated process of converting an analog signal from a primary side to a secondary side through electromagnetic conversion, and therefore greatly simplifies the substation configuration of a distribution network, lowers operation power consumption and initial construction cost. Besides, the relative wide working frequency band of high voltage sensors and current sensors avoid the magnetic saturation of the traditional transformers and eliminate the distortion of voltage and/or current signals measurement.

The integrated device suspended at a high voltage potential for the metering and protection of a distribution network provided herein comprises: a measuring current sensor for acquiring a current signal in a high voltage line and outputting measure data, a protecting current sensor for outputting protection data, and a voltage sensor for acquiring a voltage signal in a high voltage line. The voltage signal from the voltage sensor is respectively output to an electric energy metering module, a first electric signals acquisition module and a second electric signals acquisition module; the current signal from the measuring current sensor is output to the electric energy metering module, and the current signal from the protecting current sensor is respectively output to the first and the second electric signals acquiring module. The electric energy metering module processes the received voltage and current signals to calculate various electric energy data and sends the results to the first electric signals acquiring module; the first electric signals acquiring module outputs the electric energy data to a comprehensive control module via optical fibers, meanwhile, the first and the second electric signals acquiring module converts the instantaneous analog signals of protective voltage and current to digital signals; the first electric signals acquiring module outputs the instantaneous digital signals to the comprehensive control module via optical fibers, the second electric signals acquiring module directly outputs the instantaneous digital signals to the comprehensive control module; the comprehensive control module analyses the data and determines to send a protective signal or not according to the received instantaneous data, calculates the total power of 3 phases, power factors and power energy, manages the multi-fee rates, energy demand control and watt-hour fee control according to the received power energy data, and sends the calculated data to a low-voltage terminal in fixed data frame format; and the power supply of electric energy metering module, the first and the second electric signals acquisition module and the comprehensive control module are supplied by a high voltage potential suspended power supply that is arranged between two optional phase to phase high-voltage lines.

The electric energy metering module is suspended at a high voltage potential to calculate the various electric energy data of the distribution network, and the comprehensive control module is suspended at a high voltage potential to complete a protection logic judgment and the sending the protective and control instructions.

Precise CTs are adopter for measurement, and the Rogowski coils for protection, which are all work at the high voltage potential of the phase.

The voltage sensor can be a capacitive divider, a resistive divider or a V-I-V converter, which outputs a low voltage signal that is in proportion to the high voltage signal.

The suspended power supply of high voltage potential which directly acquires electric energy from the high voltage line via an energy acquisition voltage sensor specifically comprises a low voltage capacitor $C_L$, a high voltage capacitor $C_H$ and a low voltage capacitor $C_L$ that are arranged between phase to phase lines of high voltage in series, and an AC/DC conversion module is connected with the low voltage capacitor $C_L$ in parallel to acquire a DC regulated power supply.

The AC input of the AC/DC conversion module is connected with an optional low-voltage capacitor $C_L$ in parallel; an instantaneous over-voltage protector is further connected with the AC input of the AC/DC conversion module in parallel; meanwhile, current-limiting resistors R1 and R2 are connected with the AC input of the AC/DC conversion module in series, and the DC output of the AC/DC conversion module is connected with a filter capacitor C1.

The electric energy metering module comprises an electric energy metering chip and its output is connected with a central processing unit (CPU), which is respectively connected with an electrical-to-optical conversion module, an optical-to-electrical conversion module and a storage EPROM; the electric energy metering chip receives the signals from the measurement CT and the voltage sensor, carries out processing, calculation, communication and calibration on the signals, and outputs active power/energy, reactive power/energy and RMS values of voltage and current.

The CPU initializes the electric energy calculation chip, reads parameters from the storage EPROM chip, writes the read parameters into the electric energy metering chip and controls the working of the electric energy metering chip; and according to the instruction of the CPU, the electric energy metering chip transmits the electric energy data to the CPU via data lines.

The instantaneous electric data include voltage, current, power and power factor.

The optical fiber is plastic or quartz optical fiber.

The integrated device for the metering and protection of a distribution network provided herein can be adjusted or changed as needed, that is, can be separately used as an integrated protector without metering function or an integrated metering device. This device has advantages of compact structure and high integration, with an overall weight of below 20 kg.

DETAILED DESCRIPTION OF THE INVENTION

Combined with the figures, the specific realization of the present invention are described below in detail.

Figure 1:
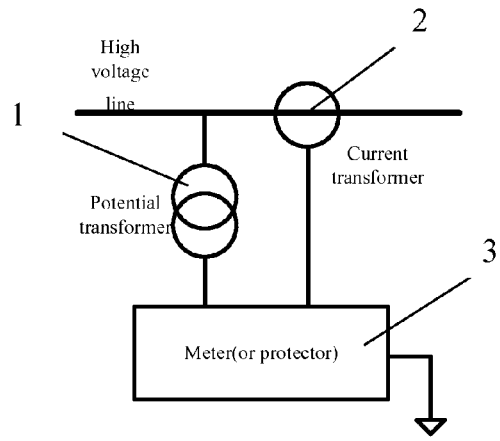
FIG. 1: principle of traditional high-voltage electric energy metering and protective device.
Figure 2:
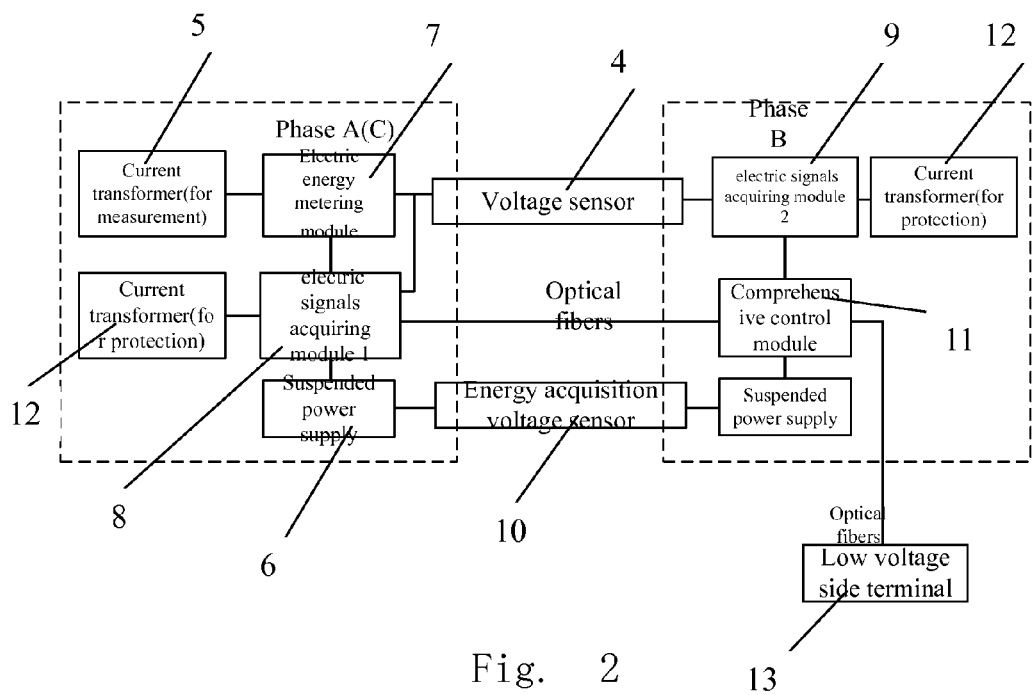
FIG. 2: principle diagram of the metering and protection integrated device suspended at a high voltage potential of the present invention.

As shown in FIG. 2, the integrated device provided herein is suspended at a high voltage potential for the metering and the protection of a distribution network and comprises a voltage sener 4, a measurement CT 5, a protective CT 12, a high voltage potential suspended power supply 6, an electric energy metering module 7, a first electric signal acquiring module 8, a second electric signal acquiring module 9, optical fibers, an energy acquiring voltage sensor 10 and a comprehensive control module 11, which are integrated with each other. The voltage signal from the voltage sensor 4 is respectively output to the electric energy metering module 7, the first electric signal acquiring module 8 and the second electric signal acquiring module 9; the current signal from the measurement CT 5 is output to the electric energy metering module 7, the current signal from the protective CT 12 is respectively output to the first and the second electric signal acquiring module 8 and 9; the electric energy metering module 7 processes the received voltage and current signals to calculate various electric energy data and sends the results to the first electric signal acquiring module 8; the first electric signal acquiring module 8 outputs the electric energy data to the comprehensive control module 11 via optical fibers, meanwhile, the first and the second electric signal acquiring module 8 and 9 convert the instantaneous analog signals of protective voltage and current to digital signals; the first electric signal acquiring module 8 outputs the instantaneous data to the comprehensive control module 11 via the optical fibers; the second electric signal acquiring module 9 directly outputs the instantaneous data to the comprehensive control module 11; the comprehensive control module 11 carries out a protection logic judgment and sends a protective instruction or not according to the received instantaneous data, carries out a comprehensive calculation according to the received instantaneous data to calculate the total power, power factor and energy data of three phases, realizes metering management functions such as multi-fee rates, energy demand control and watt-hour fee control, and sends the calculated data to a low-voltage terminal 13 in fixed data frame format.

The electric energy metering module 7, the first and the second electric signal acquiring module 8 and 9 and the comprehensive control module 11 are respectively supplied with a DC power supply by a high voltage potential suspended power supply 6 that are arranged between optional phase to phase of high voltage lines.

The voltage sensor 4 is a capacitive divider, a resistive divider or a V-I-V converter, which outputs a low voltage signal that is in proportion to a high voltage signal. The voltage sensor 4 is a mature product of the market and is therefore not described in detail herein. In the present invention, voltages are acquired on each phase of a three-phase high voltage lines with the voltage sensor 4. The capacitive divider has wider working frequency band, smaller size and ferromagnetic resonance phenomenon has not existed compared with traditional PT 3.

The measurement CT 5 is a precise CT which is used to current sampling on two phases of the three-phase high voltage line, the protective CT 12 is used to current sampling on each phase of the three-phase high voltage line; due to the equipotential application of the primary and the secondary winding of the measurement CT 5, the insulator between the primary and the secondary winding is not needed; besides, as the measurement CT 5, the high voltage potential suspended power supply 6, the electric energy metering module 7, the first electric signal acquiring module 8 and the second electric signal acquiring module 9 are integrated into an internal unit, the secondary current and rated load of measurement CT can be designed as 0.1 A and 1 VA. Therefore, the cross areas of coil windings and iron cores are greatly reduced, significantly the size and the power consumption of the measurement CT 5 are reduced rapidly.

Likewise, the protective CT 12 is a Rogowski coil, needing no insulator between the primary and the secondary winding of the traditional electromagnetic CT, therefore, the size and the power consumption of the protecting current transformer 12 are greatly reduced.

Figure 3:
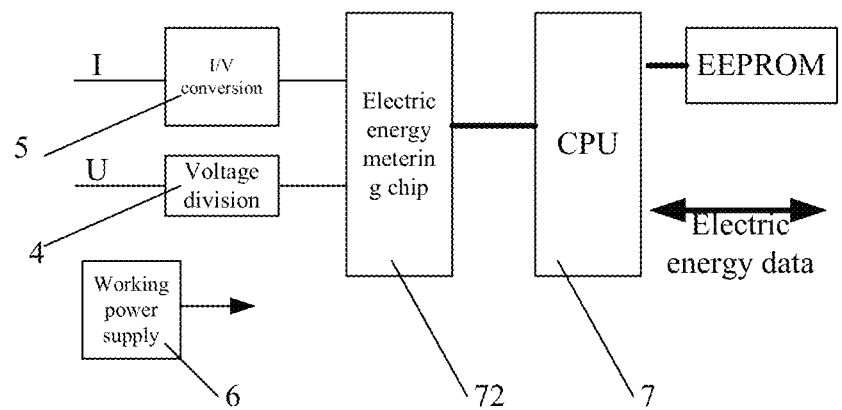
FIG. 3: principle diagram illustrating of the electric energy metering module of present invention

As shown in FIG. 3, the electric energy metering chip 72 in the electric energy metering module 7 is a voltage/current analog-to-digital converter and time division multiplier, its output is connected with the central processing unit CPU, which is respectively connected with an electrical/optical conversion module 70, an optical/electrical conversion module 71 and a memory EPROM, the electric energy metering chip 72 can receive the signals from the measurement CT 5 and the voltage sensor 4, carry out processing, calculation, communication and calibration on the signals and output active power energy, reactive power energy and real RMS values of current and voltage. Specifically, the CPU initializes the electric energy metering chip 72, reads each parameter from the EPROM chip memory, writes them into the electric energy metering chip 72, and controls the electric energy metering chip 72; according to the command given by the CPU, the electric energy metering chip 72 transmits the data to the CPU via data lines, and the CPU performs corresponding information processing through a serial communication according to the command received. The electric energy metering chip 72 is powered by the high voltage potential suspended power supply 6.

Figure 6:
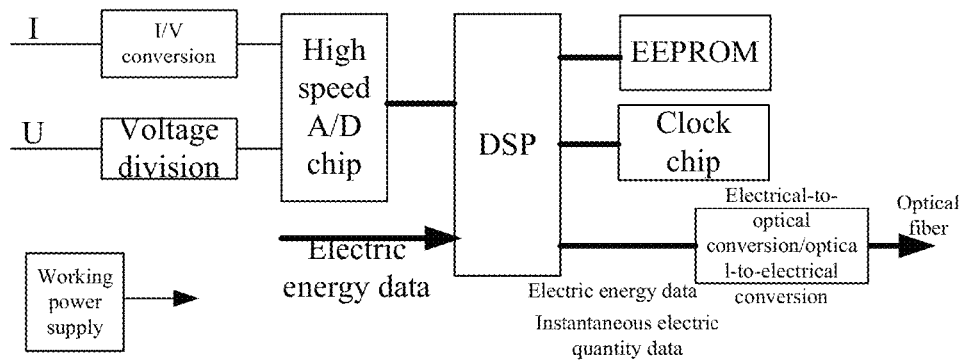
FIG. 6: schematic diagram of the first electric signals acquiring module of present invention

As shown in FIG. 6, the analog signals of current and voltage in the first electric signal acquiring module 8 are converted into instantaneous data by a high speed A/D chip, which is controlled by a DSP. The DSP also receives the electric energy data from the electric energy metering module 7 and analyzes the received electric energy data. All the analyzed electric energy data and the instantaneous data are sent to the comprehensive control module 11 at phase B via optical fibers. The first electric signal acquiring module 8 is supplied by the high voltage potential suspended power supply 6.

Figure 7:
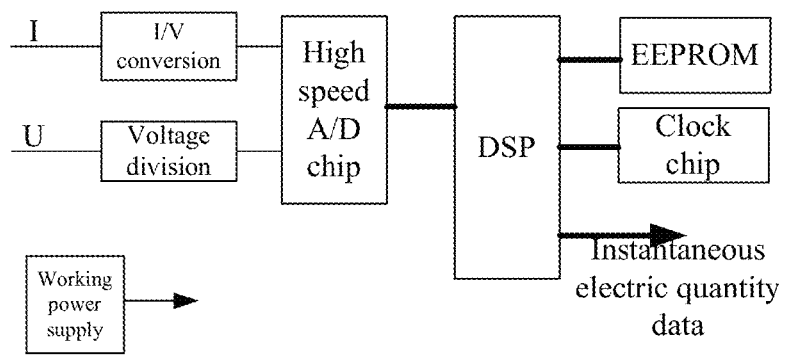
FIG. 7: schematic diagram of the second electric signals acquiring module of present invention

As shown in FIG. 7, the analog signals of current and voltage in the second electric signal acquiring module 9 are also converted to instantaneous data by the high-speed AD chip, which is controlled by a DSP. The instantaneous data are sent to the comprehensive control module 11 at phase B in a serial communication manner. The second electric signal acquiring module 9 is supplied by the high voltage potential suspended power supply.

Figure 4:
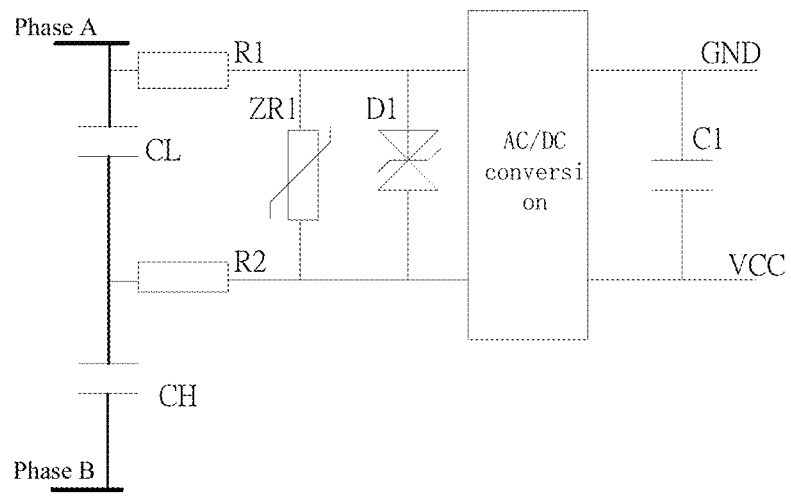
FIG. 4: principle diagram of the energy acquiring voltage sensor of present invention
Figure 5:
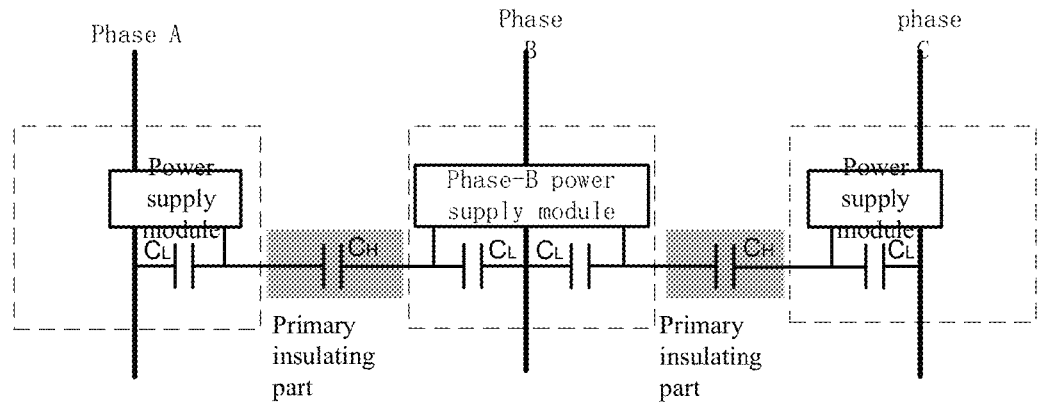
FIG. 5: schematic diagram of the power supply of the energy acquiring voltage sensor of present invention

As shown in FIG. 5, the high voltage potential suspended power supply 6 directly acquires electric energy from high voltage lines (phases A, B and C) using a separate group of high voltage capacitors 10 (also called energy acquisition voltage sensor), which comprise a low-voltage capacitor $C_L$, a high-voltage capacitor $C_H$ and a low-voltage capacitor $C_L$ that are connected between phases A and B in series; the energy acquisition voltage sensor 10 may also be arranged between phases B and C, that is, a low-voltage capacitor $C_L$, a high-voltage capacitor $C_H$ and a low-voltage capacitor $C_L$ are connected between phases B and C in series; the high voltage potential suspended power supply 6 further acquires a stable DC power supply by connecting an AC/DC conversion module with the low-voltage capacitor $C_L$ in parallel, that is, the power supply is completely suspended at a high voltage potential but not an earth potential; as long as there is a voltage in a high-voltage line, a stable DC power supply for equipotential working can be acquired and supplied to each circuit function module at the high voltage potential. The specific working principle can refer to FIG. 4, the AC input of the AC/DC conversion module is connected with the low-voltage capacitor $C_L$ in parallel, and the AC input of the AC/DC conversion module are further connected with a piezoresistor ZR1 and a transient voltage suppressor D1. Meanwhile, the AC input is connected with current-limiting resistors R1 and Re in series. The DC output of the AC/DC conversion module is connected with a filter capacitor C1. Specifically, the transient over-voltage input of the AC/DC conversion module, which is sampled from the low-voltage capacitor $C_L$, is guaranteed to be suppressed by the piezoresistor ZR1 and transient voltage suppressor D1. the output of AC/DC conversion module, which is filtered by the capacitor C1, is used by the electric energy metering module 7, the first and the second electric signal acquiring module 8 and 9 and the comprehensive control module 11.

The first electric signal acquiring module 8 directly receives the voltage and the current signals of the voltage sensor 4 and the CT 12, completes an instantaneous electric signal acquisition for voltage, current, power and power factor, and outputs the data to the comprehensive control module 11 in given format through a serial communication.

The second electric signal acquiring module 9 directly receives the voltage and the current signals from the voltage sensor 4 and the protective CT 12, completes an instantaneous electric signals acquisition for voltage, current, power and power factor, and outputs the data to the comprehensive control module 11 in given format through a serial communication.

Figure 8:
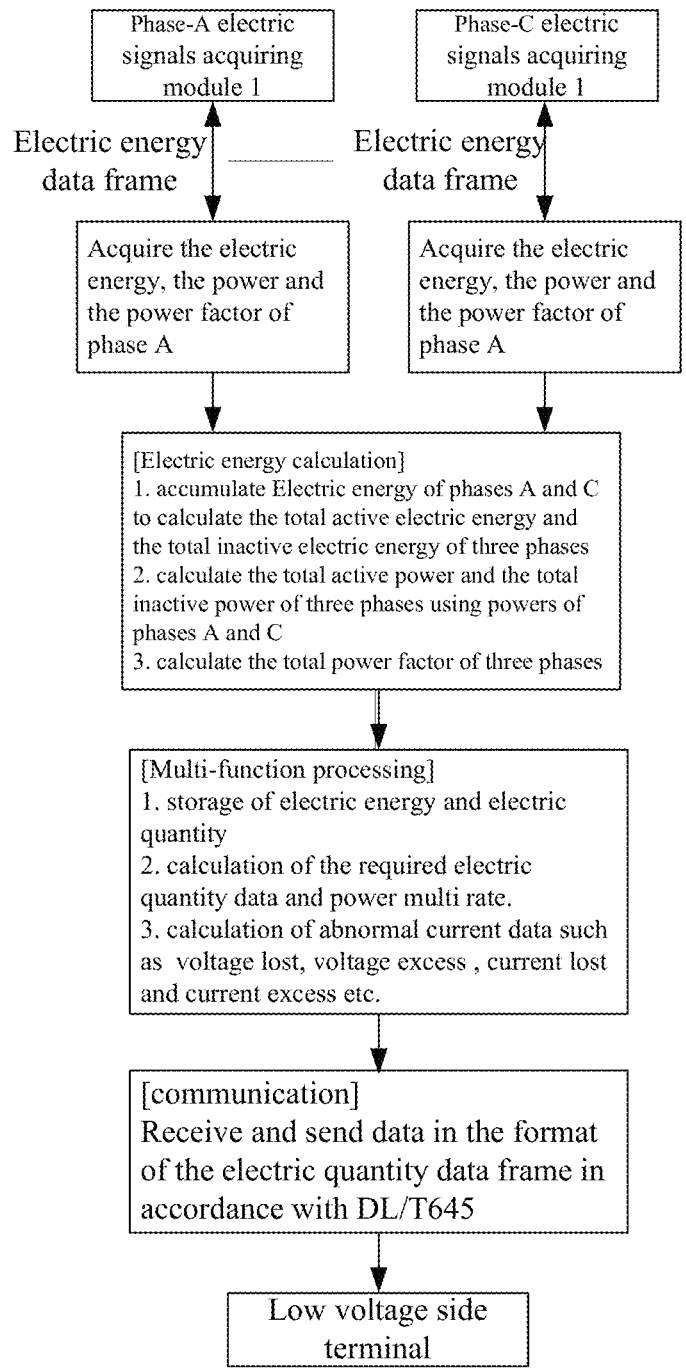
FIG. 8: flow chart of the comprehensive control module of present invention

As shown in FIG. 2, the electric energy metering module 7, the first and the second electric signal acquiring module 8 and 9 each transmit the electric energy data to the comprehensive control module 11. As shown in FIG. 8, the comprehensive control module 11 respectively acquires the electric energy, power, power factor and voltage/current value of phases A and C from the electric energy metering module 7 at phase A and the electric energy metering module 7 at phase C, performs an electric energy accumulation to acquire the total power, power factor and other electric energy data of the three phases, and finally transmits the calculated electric energy data to a low-voltage terminal 13 in a specified format.

Figure 9:
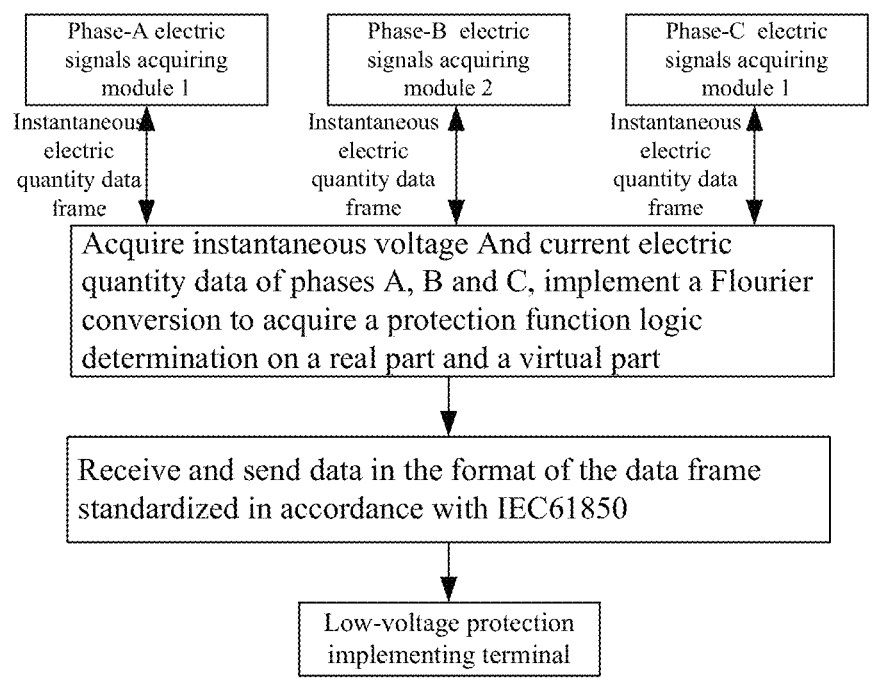
FIG. 9: flow chart of the protective function realization of the present invention.

As shown in FIG. 9, the comprehensive control module 11 further carries out a protective judgment according to the electric data from the first electric signal acquiring module 8 of phase A and phase C, the second electric signal acquiring module 9 of phase B, and sends the protective instructions to the low-voltage terminal 13 such as over-voltage protective signal, over-current quick breakup protective signal and time-limited over-current protection signal, etc. In addition, the comprehensive control module 11 further carries out metering management functions such as multi watt-hour fee, electric energy demand control and fee rate control, and sends the energy data to the low-voltage terminal in standard protocol. The algorithm and program used in the comprehensive control module 11 is easy for technical workers of this technical area, they are no more described in detail.

The invention claimed is:

1. An integrated device suspended at a high voltage potential for the metering and protection of a distribution network, comprising:
   a measurement current transformer (CT) for acquiring a current signal in a high voltage line and outputting metering data,
   a protective CT for outputting protective data, and
   a voltage sensor for acquiring a voltage signal of the high voltage line wherein the integrated device is configured such that, during operation:
      the voltage signal acquired by the voltage sensor is respectively output to an electric energy metering module, a first electric signal acquiring module and a second electric signal acquiring module;
      the current signal acquired by the measurement CT is output to the electric energy metering module, the current signal acquired by the protective CT is respectively output to the first and the second electric signal acquiring module;
      the electric energy metering module processes the received voltage and current signals to calculate various electric energy data and sends the energy data to the first electric signal acquiring module;
      the first electric signal acquiring module outputs the energy data to a comprehensive control module via optical fibers;
      the first and the second electric signal acquiring module convert the received protective voltage and current signals to instantaneous data;
      the first electric signal acquiring module outputs the instantaneous data to the comprehensive control module via optical fibers;
      the second electric signal acquiring module convert the received protective voltage and current signals to instantaneous data and directly outputs the data to the comprehensive control module;
      the comprehensive control module carries out a protective judgment and sends a protective instruction according to the received instantaneous electric data, carries out a comprehensive calculation according to the received energy data to calculate the total power, power factor and electric energy of three phases, realizes calculation management functions such as multi fee, electric energy demand control and fee rate control, and sends the calculated data to a low-voltage terminal in fixed format; and
      the electric energy metering module, the first and the second electric signal acquiring module and the comprehensive control module are supplied with a DC supply by a high voltage potential suspended power supply that is arranged between optional phase to phase lines of high voltage.

2. The integrated device suspended at a high voltage potential for the metering and protection of the distribution network according to claim 1, wherein the electric energy metering module is suspended at a high voltage potential and calculates the various electric energy data of the distribution network, and the comprehensive control module is suspended at a high voltage potential and completes a protective judgment and the sends a protective instruction.

3. The integrated device suspended at a high voltage potential for the metering and protection of the distribution network according to claim 1, wherein the measurement CT is precise, the protective CT is a Rogowski coil, and the measurement CT and the protective CT both work at the high voltage equipotential of each phase.

4. The integrated device suspended at a high voltage potential for the metering and protection of the distribution network according to claim 1, wherein the voltage sensor is a capacitive divider, a resistive divider or a V-I-V converter, which outputs a low voltage signal that is in proportion to a high voltage signal.

5. The integrated device suspended at a high voltage potential for the metering and protection of the distribution network according to claim 1, wherein the high voltage potential suspended power supply directly acquires electric energy from the high voltage line via an energy acquisition voltage sensor, and specifically comprises a low voltage capacitor $C_L$, a high voltage capacitor $C_H$ and a first low voltage capacitor $C_L$ that are arranged between phase to phase lines of high voltage in series, and an AC/DC conversion module is connected with the low voltage capacitor $C_L$ in parallel to acquire a stable DC power supply.

6. The integrated device suspended at a high voltage potential for the metering and protection of the distribution network according to claim 5, wherein the AC input of the AC/DC conversion module is connected with a second low-voltage capacitor $C_L$ in parallel; a transient over-voltage protector is further connected with AC input of the AC/DC conversion module in parallel; meanwhile, current-limiting resistors R1 and R2 are connected with the AC input of the AC/DC conversion module in series, and the DC output of the AC/DC conversion module is connected with a filter capacitor C1.

7. The integrated device suspended at a high voltage potential for the metering and protection of the distribution network according to claim 1, wherein the electric energy metering module comprises an electric energy metering chip, the output of which is connected with a central processing unit (CPU), which is respectively connected with an electrical-to-optical conversion module, an optical-to-electrical conversion module and a storage EPROM; the electric energy metering chip receives the signals from the measurement CT and the voltage sensor, carries out processing, calculation, communication and calibration on the signals and outputs active power/energy, reactive power/energy and real RMS values of voltage and current.

8. The integrated device suspended at a high voltage potential for the metering and protection of the distribution network according to claim 7, wherein the CPU initializes the electric energy metering chip, reads parameters from the storage EPROM chip, writes the parameters into the electric energy metering chip and controls the working of the electric energy metering chip; and according to the instruction from CPU, the electric energy metering chip transmits the electric energy data to the CPU via data lines.

9. The integrated device suspended at a high voltage potential for the metering and protection of the distribution network according to claim 1, wherein the instantaneous electric data comprises voltage, current, power and power factor.

10. The integrated device suspended at a high voltage potential for the metering and protection of the distribution network according to claim 1, wherein the optical fiber is plastic or quartz optical fiber.

* * * * *